(12) United States Patent
Yu et al.

(10) Patent No.: US 11,811,957 B2
(45) Date of Patent: Nov. 7, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yuanhao Yu, Kaohsiung (TW); Chung Ju Yu, Kaohsiung (TW); Jui-Hsien Wang, Kaohsiung (TW); Chai-Chi Lin, Kaohsiung (TW); Hong Jie Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 65 days.

(21) Appl. No.: 17/324,958

(22) Filed: May 19, 2021

(65) Prior Publication Data
US 2022/0377161 A1    Nov. 24, 2022

(51) Int. Cl.
*H04M 1/02*    (2006.01)
*H01L 25/16*    (2023.01)
*H01L 23/498*    (2006.01)

(52) U.S. Cl.
CPC ...... *H04M 1/0202* (2013.01); *H01L 23/4985* (2013.01); *H01L 25/16* (2013.01)

(58) Field of Classification Search
CPC .... H04M 1/02; H04M 1/0202; H04M 1/0206; H04M 1/0208; H04M 1/0214; H04M 1/0225; H04M 1/0243; H04M 1/0247; H04N 1/0241; H01L 23/4985; H01L 25/16; H04L 25/16
See application file for complete search history.

(56) References Cited

U.S. PATENT DOCUMENTS

| | | | |
|---|---|---|---|
| 7,176,961 B2 * | 2/2007 | Shimamura | H04M 1/0214 455/550.1 |
| 8,851,390 B2 | 10/2014 | Ikemoto | |
| 9,157,994 B2 * | 10/2015 | Rofougaran | H04B 1/0458 |
| 9,191,055 B2 * | 11/2015 | Lehmann | H04B 1/3838 |
| 11,575,452 B2 * | 2/2023 | Merlin | H04W 16/20 |
| 2020/0112081 A1 | 4/2020 | Kim et al. | |

* cited by examiner

*Primary Examiner* — Quochien B Vuong
(74) *Attorney, Agent, or Firm* — FOLEY & LARDNER LLP

(57) ABSTRACT

At least some embodiments of the present disclosure relate to a semiconductor device package. The semiconductor device package comprises a substrate, an antenna, and an active component. The antenna is disposed at least partially within the substrate. The active component is disposed on the substrate and electrically connected to the antenna. A location of the antenna is configured to be adjustable with respect to a location of the active component.

15 Claims, 15 Drawing Sheets

SEMICONDUCTOR DEVICE PACKAGE AND METHOD OF MANUFACTURING THE SAME

BACKGROUND

1. Technical Field

The present disclosure relates to a semiconductor device package. More particularly, the present disclosure relates to a semiconductor device package comprising an antenna and an active component, the location of the antenna being adjustable with respect to a location of the active component.

2. Description of the Related Art

In 5G wireless communication technology, cell phones typically include antennas for transmitting and receiving radio frequency (RF) signals. The development of mobile communication has caused a demand for high data rates and stable communication quality, and high frequency wireless transmission (e.g., 28 GHz or 39 GHz) has become one of the most important topics in the mobile communication industry. Since the wavelength is relatively small, loss of signal transmission is relatively high. Antenna arrangements are used for increasing gains of RF signals in one direction. Accordingly, in a cell phone, antennas would be arranged on multiple lateral sides of the cell phone. However, the via wall structure, etching tolerance, or surface roughness of traditional antennas may cause significant signal loss.

SUMMARY

In some embodiments, according to one aspect, a semiconductor device package comprises a substrate, an antenna, and an active component. The antenna is disposed at least partially within the substrate. The active component is disposed on the substrate and electrically connected to the antenna. A location of the antenna is configured to be adjustable with respect to a location of the active component.

In some embodiments, according to another aspect, a semiconductor device package comprises a substrate and an antenna. The substrate has a first surface and a second surface opposite to the first surface. The substrate further includes a first dielectric layer adjacent to the first surface and a second dielectric layer adjacent to the second surface. The antenna is disposed at least partially within the substrate. The substrate defines a recess partially penetrating the substrate from the first surface toward the second surface. The recess exposes a portion of the first dielectric layer.

In some embodiments, according to another aspect, a method is disclosed for manufacturing a semiconductor device package. The method includes: providing a substrate, the substrate including an antenna and an active component; and removing a portion of the substrate to define a recess between the antenna and the active component so that the substrate is bendable to change respective locations of the antenna and the active component.

DETAILED DESCRIPTION

Figure 1A:
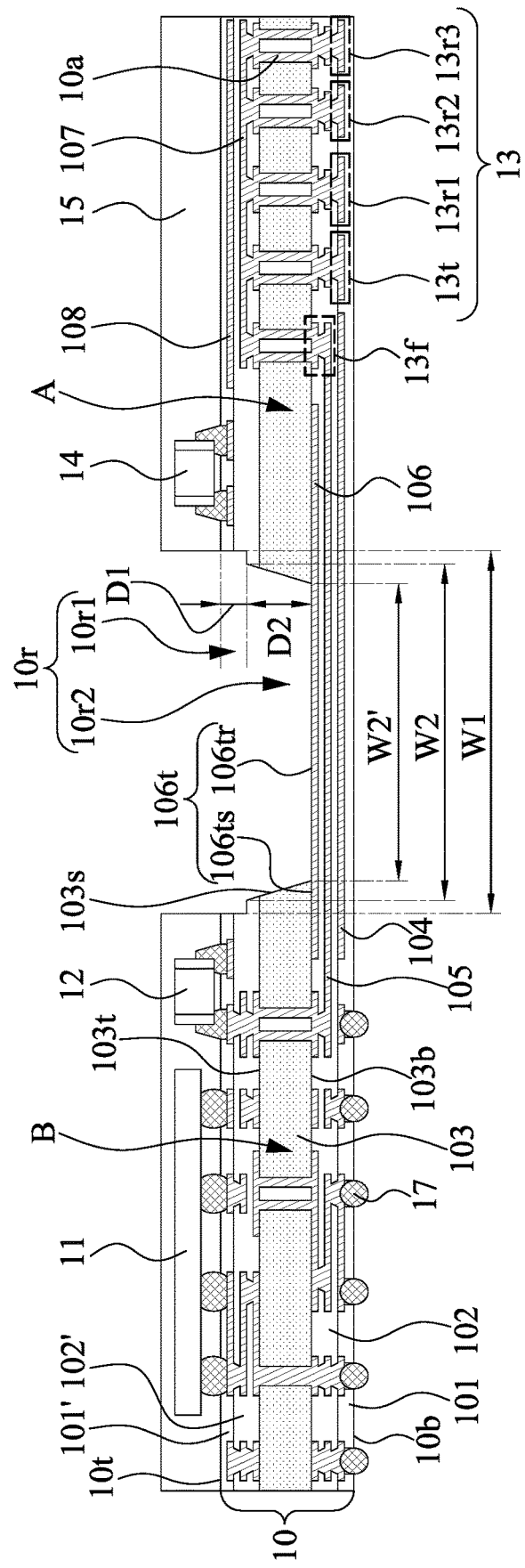
FIG. 1A illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of the embodiments of this disclosure are not deviated from by such arrangement.

FIG. 1A is a cross-sectional view of a semiconductor package structure 1 in accordance with some embodiments of the present disclosure. The semiconductor package structure 1 includes a substrate 10, an electronic component 11, an electronic component 12, an antenna 13, an electronic component 14, an encapsulant 15, and a solder ball 17. The semiconductor package structure 1 further has a recess 10r including a portion 10r1 and a portion 10r2. The semiconductor package structure 1 may be an adjustable structure. For example, the semiconductor device structure 1 can be configured to be adjustable (e.g., bendable, foldable, or twistable). The semiconductor device structure 1 may be an electronic apparatus, such as an earphone, a smart watch, a smart band, smart glasses, or so on.

The substrate 10 includes a top surface 10t and a bottom surface 10b opposite the top surface 10t. The substrate 10 defines a recess 10r partially penetrating the substrate 10 from the top surface 10t toward the bottom surface 10b. The substrate 10 may include dielectric materials and conductive materials. The substrate 10 includes a dielectric layer 101, a dielectric layer 101', a dielectric layer 102, a dielectric layer 102', a dielectric layer 103, a conductive layer 104, a conductive layer 105, a conductive layer 106, a conductive layer 107, a conductive layer 108, and a conductive via 10a. The conductive layer 104, 105, 106, 107, or 108 may be a patterned conductive layer. The conductive layer 104, 105, 106, 107, or 108 is, or includes, a conductive material such as a metal or metal alloy. Examples of the conductive material include Au, Ag, Cu, Pt, Pd, or an alloy thereof. The substrate 10 is configured to be adjustable to adjust a respective location of the antenna 13 and the electronic component 11. The substrate 10 is configured to be bendable, foldable, or twistable to adjust a respective location of the antenna 13 and the electronic component 11 so as to flexibly control an orientation or signal radiation direction of the antenna 13. In some embodiments, the substrate 10 may include an interconnection structure, such as a redistribution layer (RDL) or a grounding element. The grounding element may be a via that is exposed from a lateral surface of the substrate 10. The grounding element may be a metal layer exposed from the lateral surface of the substrate 10. The grounding element may be a metal trace exposed from the lateral surface of the substrate 10. The substrate 10 may include a conductive pad or a conducive trace. In some embodiments, the substrate 10 may be or include an emitting element having one or more emitting components (e.g., an antenna, a light emitting element, a sensor or the like) disposed thereon. The emitting components may emit wireless signals. The antenna may emit an electromagnetic wave. The light emitting element may emit a light wave. The sensor may emit a sound wave.

The dielectric layer 101 is adjacent to the bottom surface 10b of the substrate 10. The dielectric layer 101 is a bottom dielectric layer of the substrate 10. The dielectric layer 101 is an adjustable dielectric layer. The dielectric layer 101 is a flexible dielectric layer. The dielectric layer 101 is a bendable, foldable, or twistable dielectric layer. The dielectric layer 101 may be a solder resist layer. The dielectric layer 102 is adjacent to the bottom surface 10b of the substrate 10. The dielectric layer 102 is disposed on the dielectric layer 101. The dielectric layer 102 is an adjustable dielectric layer. The dielectric layer 102 is a flexible dielectric layer. The dielectric layer 102 is a bendable, foldable, or twistable dielectric layer. The dielectric layer 102 may be a polyimide (PI), a polypropylene (PP), an epoxy-based material, or a combination of two or more thereof. The dielectric layers 101, 102 define a bendable region. The bendable region is between the electronic component 11 and the antenna 13. A signal path between the electronic component 11 and the antenna 13 passes through the bendable region.

The dielectric layer 103 includes a top surface 103t, a bottom surface 103b opposite the top surface 103t, and a lateral surface 103s extending between the top surface 103t and the bottom surface 103b. The top surface 103t of the dielectric layer 103 faces the dielectric layer 102'. The bottom surface 103b of the dielectric layer 103 faces the dielectric layer 102. The lateral surface 103s of the dielectric layer 103 is inclined inwardly from the top surface 103t toward the bottom surface 103b of the dielectric layer 103. The lateral surface 103s of the dielectric layer 103 is exposed from the recess 10r. The dielectric layer 103 is fully penetrated by the recess 10r. The dielectric layer 103 is disposed on the dielectric layer 102. The dielectric layer 103 is a rigid dielectric layer. The dielectric layer 103 may be a core layer. The dielectric layer 103 is a rigid region. The dielectric layer 103 is a non-bendable layer. A thickness of the rigid region is greater than a thickness of the bendable region. The dielectric layer 103 includes a rigid region A at which the antenna 13 is disposed. The dielectric layer 103 includes a rigid region B at which the electronic component 11 is disposed. The rigid region A and the rigid region B are separated by the bendable region of the dielectric layers 101, 102. In some embodiments, the rigid region A and the rigid region B may define an angle less than 180 degrees. The dielectric layer 103 acts as a resonance cavity for the antenna 13. A thickness of the dielectric layer 103 may be ranged from about 300 μm to about 500 μm. The dielectric layer 103 may be made of a bismaleimide-triazine (BT) resin or a glass-reinforced epoxy composite (e.g., an FR-4 composite).

The dielectric layer 102' is disposed on the top surface 103t of the dielectric layer 103. The dielectric layer 102' is partially exposed from the recess 10r. The dielectric layer 102' is an adjustable dielectric layer. The dielectric layer 101' is adjacent to the top surface 10t of the substrate 10. The dielectric layer 101' is a top dielectric layer of the substrate 10. The dielectric layer 101' is partially exposed from the recess 10r. The dielectric layer 101' is an adjustable dielectric layer. In some embodiments, the material and characteristics of the dielectric layer 101' may be the same as or different from those of the dielectric layer 101. The material and characteristics of the dielectric layer 102' may be the same as or different from those of the dielectric layer 102.

The conductive layer 104 is adjacent to the bottom surface 10b of the substrate 10. The conductive layer 104 is disposed on the dielectric layer 101. A portion of the conductive layer 104 is exposed from the dielectric layer 101. The conductive layer 104 is configured to function as a ground layer of the antenna 13.

The conductive layer 105 is disposed within the dielectric layer 102. The conductive layer 105 is configured to function as a signal transmission layer. The conductive layer 105 electrically connects the electronic component 11 with the antenna 13. The conductive layer 105 is under the recess 10r and free from being exposed from the recess 10r.

The conductive layer 106 is disposed on the dielectric layer 102. The conductive layer 106 is disposed adjacent to the dielectric layer 103. The conductive layer 106 is disposed on the bottom surface 103b of the dielectric layer 103. A portion of the conductive layer 106 is exposed from the recess 10r. The conductive layer 106 defines a bottom surface of the recess 10r. The conductive layer 106 includes a top surface 106t having a first portion 106ts in contact with the dielectric layer 103 and a second portion 106tr exposed from the recess 10r. A roughness (e.g., surface roughness Ra) of the first portion 106ts of the top surface 106t of the conductive layer 106 is less than a roughness of the second portion 106tr of the top surface 106t of the conductive layer

106. A roughness of a lateral surface or a bottom surface of the conductive layer 106 is less than a roughness of the second portion of the top surface of the conductive layer 106. The conductive layer 106 is configured to function as a ground layer of the antenna 13.

The conductive layer 107 is disposed within the dielectric layer 102'. The conductive layer 107 is configured to function as a ground layer for the antenna 13. The conductive layer 105 is under the recess 10r and free from being exposed from the recess 10r.

The conductive layer 108 is adjacent to the top surface 10t of the substrate 10. The conductive layer 108 is disposed in the dielectric layer 101'. The conductive layer 108 is configured to function as a ground layer or a signal transmission layer. The electronic component 11, 12, or 14 may be directly in contact with the conductive layer 108.

The conductive via 10a partially penetrates the substrate 10 and electrically connects the conductive layer 105 with the antenna 13. The conductive via 10a is configured to function as a feeding line of the antenna 13. The conductive via 10a may have a solid structure or a hollow structure.

The recess 10r is located between the antenna 13 and the electronic component 11. The recess 10r fully penetrates the dielectric layers 101', 102', and 103. The first portion 10r1 of the recess 10r penetrates a first portion of the dielectric layer 102'. The first portion of the dielectric layer 102' defines the first portion 10r1 of the recess 10r. The second portion 10r2 of the recess 10r penetrates a second portion of the dielectric layer 102' and the dielectric layer 103. The second portion of the dielectric layer 102' and the dielectric layer 103 define the second portion 10r2 of the recess 10r. The first portion 10r1 of the recess 10r is discontinuous to the second portion 10r2 of the recess 10r.

In some embodiments, the first portion 10r1 of the recess 10r may have a cylindrical, rectangular, or a square structure. The first portion 10r1 of the recess 10r has a substantially uniform width W1. The first portion 10r1 of the recess 10r has a depth D1. The second portion 10r2 of the recess 10r is tapered from the dielectric layer 102' toward the dielectric layer 103. The second portion 10r2 of the recess 10r has a depth D2. The depth D2 is greater than the depth D1. A roughness Ra1 (e.g., surface roughness, Ra) of a sidewall of the first portion 10r1 of the recess 10r is different from a roughness Ra2 of a sidewall of the second portion 10r2 of the recess 10r. The roughness Ra1 is greater than the roughness Ra2. A maximum width W2 of the second portion 10r2 of the recess 10r is less than the width of the first portion 10r1 of the recess 10r. A minimum width W2' of the second portion 10r2 of the recess 10r is large enough such that the substrate 10 is able to be bent to change respective locations of the electronic component 11 and the antenna 13. In some embodiments, the rigid region A of the dielectric layer 103 of the substrate 10 may be substantially perpendicular to the rigid region B of the dielectric layer 103 of the substrate 10.

The recess 10r defines a first region having a first bendability. The remaining region is a second region having a second bendability. The first bendability is higher than the second bendability. For example, the first region is more bendable compared with the remaining region.

The electronic component 11 is disposed on the dielectric layer 101'. The electronic component 11 is disposed on the top surface 10t of the substrate 10. In some embodiments, the electronic component 11 may include one or more of a controller, a processor, a digital signal processor (DSP), an application-specific integrated circuit (ASIC) or other electronic components or semiconductor devices. The electronic component 11 may communicate with the antenna 13 through the conductive layer 105. The electronic component 11 may control the antenna 13 through the conductive layer 105. The electronic component 11 may transmit a signal to the antenna 13. The electronic component 11 may receive a signal from the antenna 13.

In some embodiments, the electronic component 11 may recognize a status of the object and adjusts the electronic apparatus from one mode to another mode. The modes may include receiving a call, rejecting a call, volume or microphone control, touch panel switching, proximity sensor reception, noise reduction, external device boot, shutdown, and so on.

The electronic components 12 and 14 are disposed on the dielectric layer 101'. The electronic components 12 and 14 are disposed on the top surface 10t of the substrate 10. The electronic component 12 is disposed on the rigid region B of the dielectric layer 103 of the substrate 10. The electronic component 12 is adjacent to the electronic component 11. The electronic component 14 is disposed on the rigid region A of the dielectric layer 103 of the substrate 10. The electronic component 14 is adjacent to the antenna 13.

The antenna 13 disposed adjacent to the top surface 10t of the substrate 10. The antenna 13 is disposed at least partially within the substrate 10. The antenna 13 includes a feeding terminal 13f, an antenna unit 13t, an antenna unit 13r1, an antenna unit 13r2, and an antenna unit 13r3. The feeding terminal 13f is connected to the conductive layer 105. A signal transmitted from the electronic component 11 is fed to the feeding terminal 13f. The antenna unit 13t may be configured to radiate an electromagnetic wave toward an object. The antenna unit 13r1, 13r2, or 13r3 may be configured to receive an electromagnetic wave reflected from the object. In some embodiments, the antenna 13 may be an antenna array. The antenna 13 may be used for detecting a gesture or a movement of a user. The antenna 13 may operate in a frequency band from 57 GHz to 64 GHz.

In some embodiments, the antenna unit 13t may be configured to radiate a first electromagnetic wave toward an object. The antenna unit 13r1 is configured to receive a second electromagnetic wave reflected from the object. The electronic component 11 is configured to generate a first signal in response to the second electromagnetic wave. The first signal is used for determining an appearance of the object.

The antenna unit 13r2 is configured to receive a third electromagnetic wave reflected from the object. The electronic component 11 is configured to generate a second signal in response to the third electromagnetic wave. The second signal is used for determining a velocity of the object or a distance between the object and the antenna unit 13r2 in a first dimension.

The antenna unit 13r3 is configured to receive a fourth electromagnetic wave reflected from the object. The electronic component 11 is configured to generate a third signal in response to the fourth electromagnetic wave. The third signal is used for determining a velocity of the object or a distance between the object and the antenna unit 13r2 in a second dimension different from the first dimension. In some embodiments, the configurations of the antenna units 13r1, 13r2, and 13r3 may be replaced with one another.

The encapsulant 15 is disposed on the top surface 10t of the substrate 10. The encapsulant 15 encapsulates or covers the electronic components 11, 12, and 14. The encapsulant 15 is fully penetrated by the recess 10r. A first portion of the encapsulant 15 disposed on the rigid region A of the dielectric layer 103 and a second portion of the encapsulant 15 disposed on the rigid region B of the dielectric layer 103 are spaced by a distance (i.e., the width W1). In some embodiments, a backside of the electronic component 11 is exposed by the encapsulant 15. The backside of the electronic component 11 and a top surface of the encapsulant 15 are substantially coplanar with each other.

The solder ball 17 is disposed on the bottom surface 10b of the substrate 10. The solder ball 17 may be electrically connected to an external device, such as a printed circuit board (PCB).

Figure 1B:
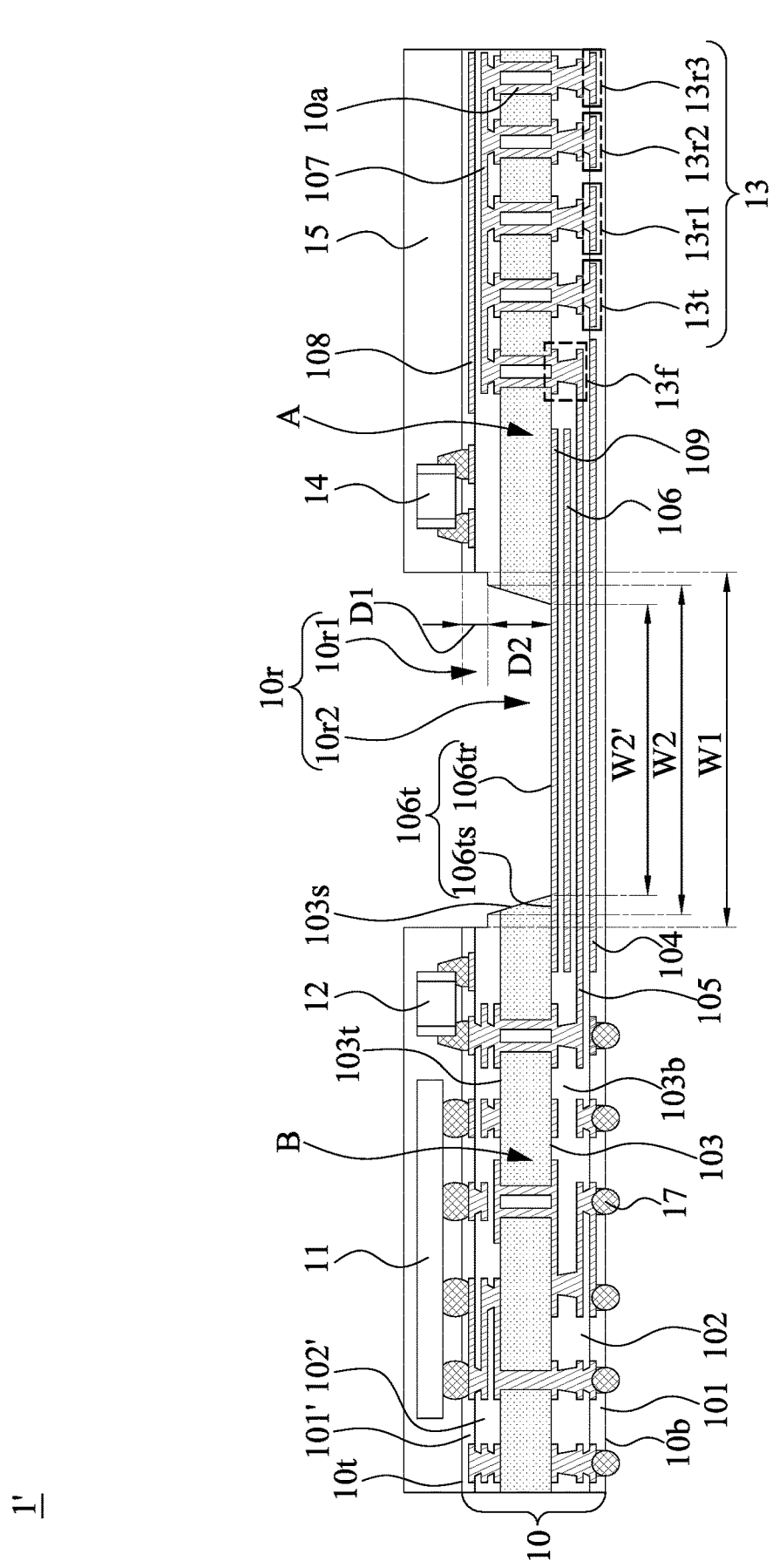
FIG. 1B illustrates a cross-sectional view of a semiconductor device package according to some embodiments of the present disclosure.

FIG. 1B is a cross-sectional view of a semiconductor device package 1' in accordance with some embodiments of the present disclosure. The semiconductor device package 1' is similar to the semiconductor device package 1 in FIG. 1A except that the conductive layer 106 is disposed in the dielectric layer 102 and a conductive layer 109 is disposed adjacent to the bottom surface 103b of the dielectric layer 103.

The conductive layer 109 is disposed on the bottom surface 103b of the dielectric layer 103. A portion of the conductive layer 109 is exposed from the recess 10r. The conductive layer 109 defines a bottom surface of the recess 10r. The conductive layer 109 is disposed between the recess 10r and the conductive layer 106. The conductive layer 109 includes a top surface having a first portion in contact with the dielectric layer 103 and a second portion exposed from the recess 10r. A roughness of the first portion of the top surface of the conductive layer 109 is less than a roughness of the second portion of the top surface of the conductive layer 109. A roughness of a lateral surface or a bottom surface of the conductive layer 109 is less than a roughness of the second portion of the top surface of the conductive layer 109. The conductive layer 109 is configured to function as a stop layer for the recess 10r. Such arrangement of the conductive layers 104, 105, 106, and 109 may improve signal transmission in a bendable region of the substrate 10.

Figure 2:
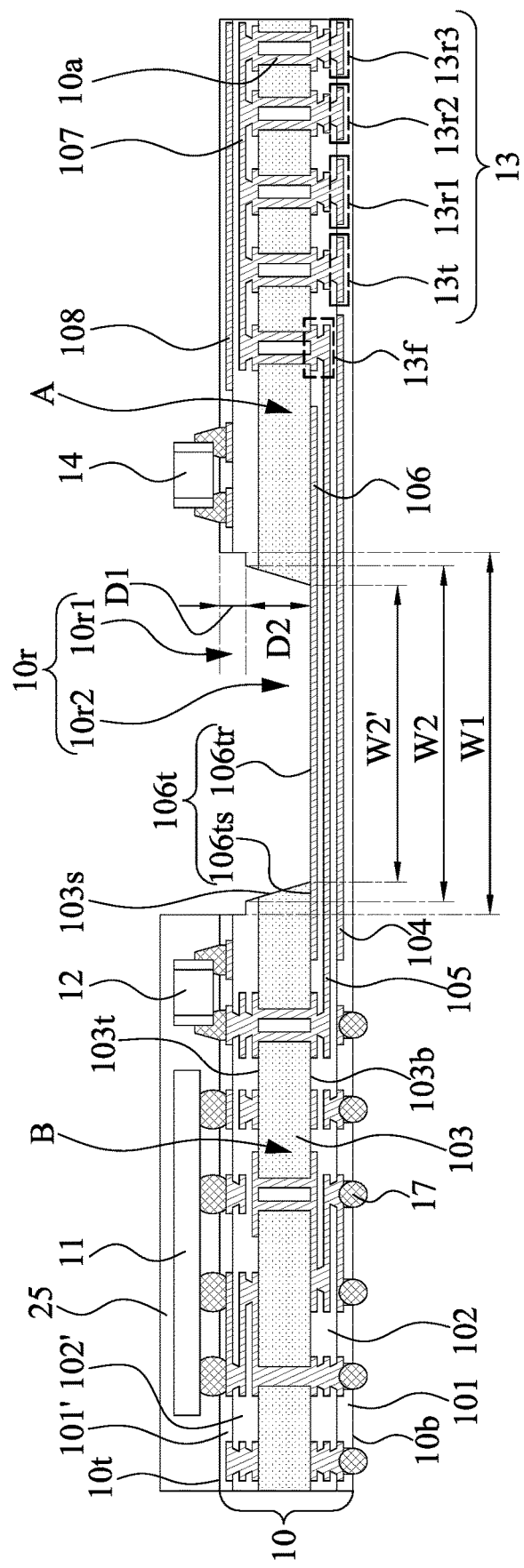
FIG. 2 illustrates a cross-sectional view of a semiconductor device package according to some embodiments of the present disclosure.

FIG. 2 illustrates a cross-sectional view of a semiconductor device package 2 according to some embodiments of the present disclosure. The semiconductor device package 2 is similar to the semiconductor device package 1 in FIG. 1A except that an encapsulant 25 is merely disposed on the rigid region B of the dielectric layer 103 and the electronic component 14 is exposed on the top surface 10t of the substrate 10.

FIG. 3A through FIG. 3F illustrate some embodiments of a method of manufacturing the semiconductor package structure 1 according to some embodiments of the present disclosure.

Figure 3A:
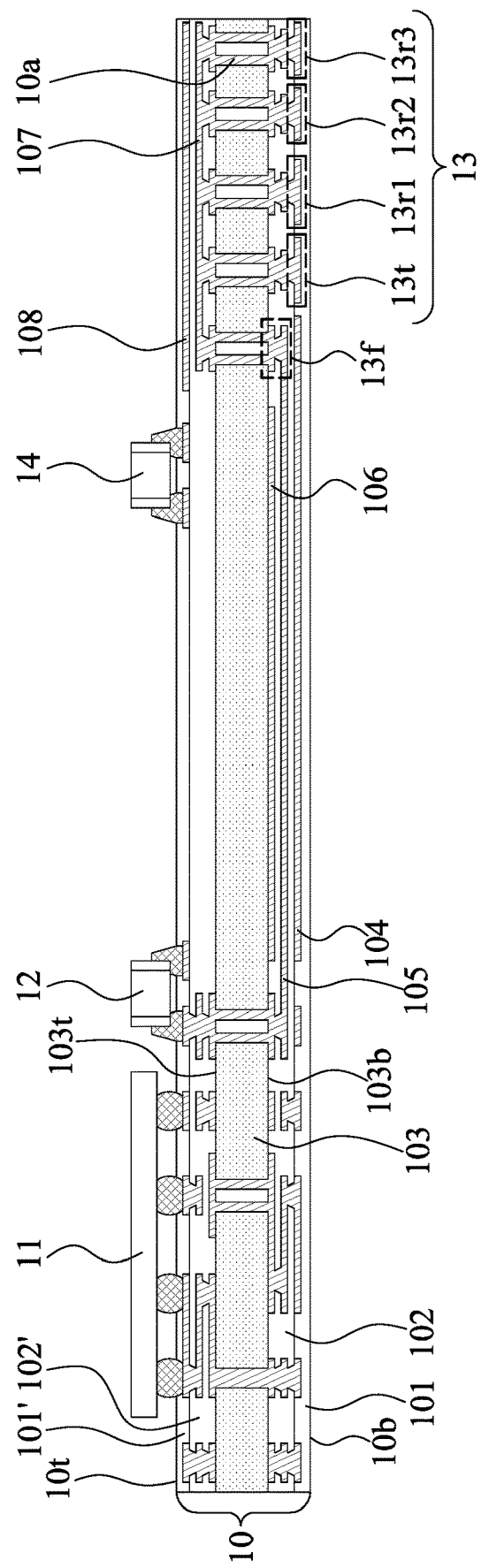
FIG. 3A illustrates a method of manufacturing a semiconductor device package according to some embodiments of the present disclosure.

Referring to FIG. 3A, a method for manufacturing the semiconductor package structure 1 includes providing a substrate 10. The substrate 10 includes a top surface 10t and a bottom surface 10b opposite the top surface 10t. The substrate 10 includes an electronic component 11, an electronic component 12, an electronic component 14, and an antenna 13. The electronic components 11, 12, 14 are disposed on the top surface 10t of the substrate 10. The antenna 13 is adjacent to the top surface 10t of the substrate 10. The electronic component 11 is an active component. The electronic components 12, 14 are passive devices.

The substrate 10 includes a dielectric layer 101, a dielectric layer 101', a dielectric layer 102, a dielectric layer 102', a dielectric layer 103, a conductive layer 104, a conductive layer 105, a conductive layer 106, a conductive layer 107, a conductive layer 108, and a conductive via 10a. The dielectric layer 101, a dielectric layer 101', a dielectric layer 102, a dielectric layer 102', or a dielectric layer 103 may include respective dielectric material.

The dielectric layer 101 is adjacent to the bottom surface 10b of the substrate 10. The dielectric layer 101 is a bottom dielectric layer of the substrate 10. The dielectric layer 101 is an adjustable dielectric layer. The dielectric layer 102 is adjacent to the bottom surface 10b of the substrate 10. The dielectric layer 102 is an adjustable dielectric layer. The dielectric layers 101, 102 define a bendable region. The bendable region is between the electronic component 11 and the antenna 13. A signal path between the electronic component 11 and the antenna 13 passes through the conductive layer 105 in the bendable region.

The dielectric layer 103 includes a top surface 103t and a bottom surface 103b opposite the top surface 103t. The dielectric layer 103 is disposed on the dielectric layer 102. The dielectric layer 103 is a core layer. The dielectric layer 103 is a rigid region.

The dielectric layer 102' is disposed on the top surface 103t of the dielectric layer 103. The dielectric layer 101' is adjacent to the top surface 10t of the substrate 10. The dielectric layer 101' is a top dielectric layer of the substrate 10. The dielectric layers 101', 102' are adjustable dielectric layers.

Figure 3B:
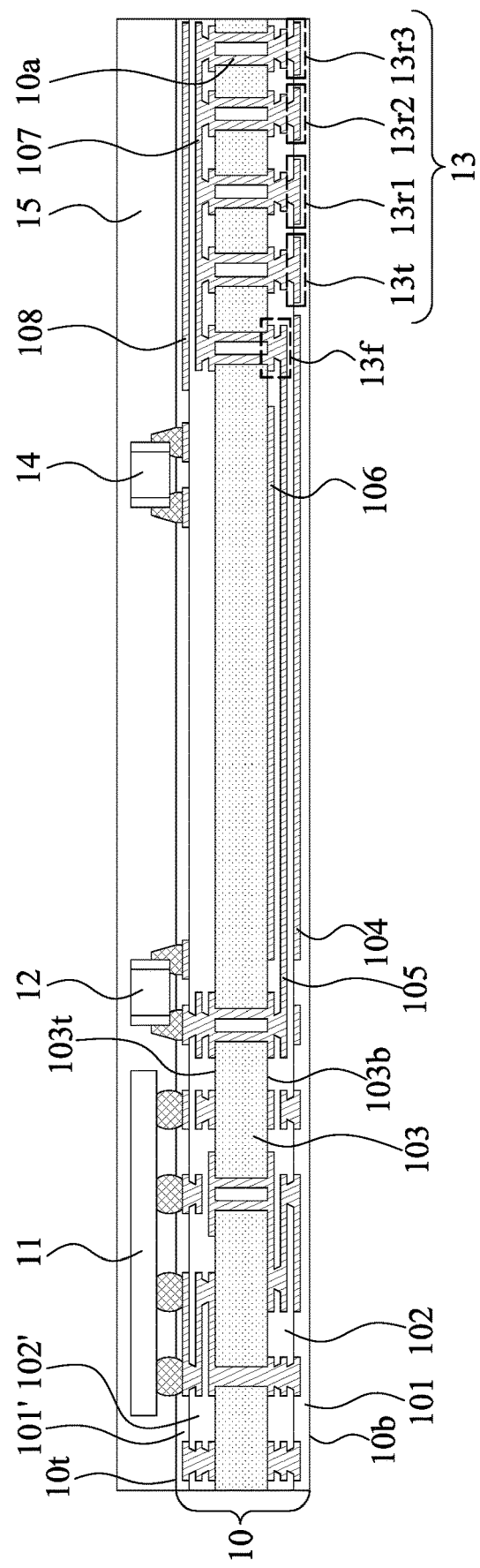
FIG. 3B illustrates a method of manufacturing a semiconductor device package according to some embodiments of the present disclosure.

Referring to FIG. 3B, an encapsulant 15 is disposed on the top surface 10t of the substrate 10 during a molding operation. The encapsulant 15 covers the electronic components 11, 12, and 14.

In some embodiments, a portion of the encapsulant 15 may be removed during a grinding operation. A backside of the electronic component 11 and a top surface of the encapsulant 15 are substantially coplanar with each other.

Figure 3C:
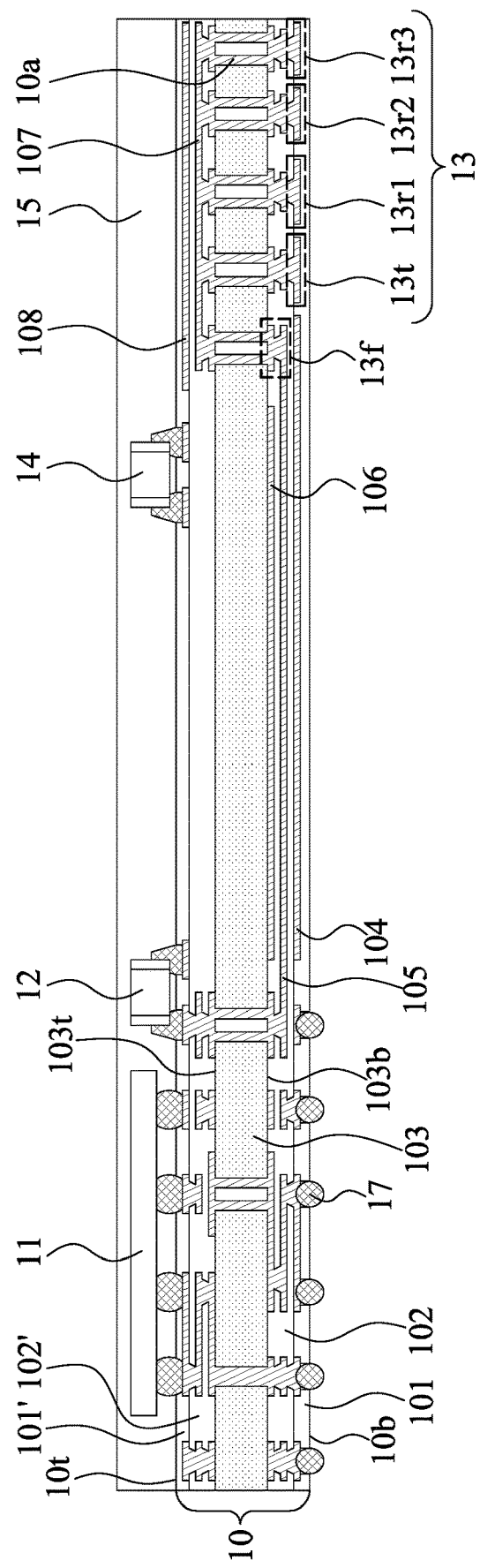
FIG. 3C illustrates a method of manufacturing a semiconductor device package according to some embodiments of the present disclosure.

Referring to FIG. 3C, a solder ball 17 is disposed on the bottom surface 10b of the substrate 10. The solder ball 17 may be electrically connected to an external device, such as a PCB.

Figure 3D:
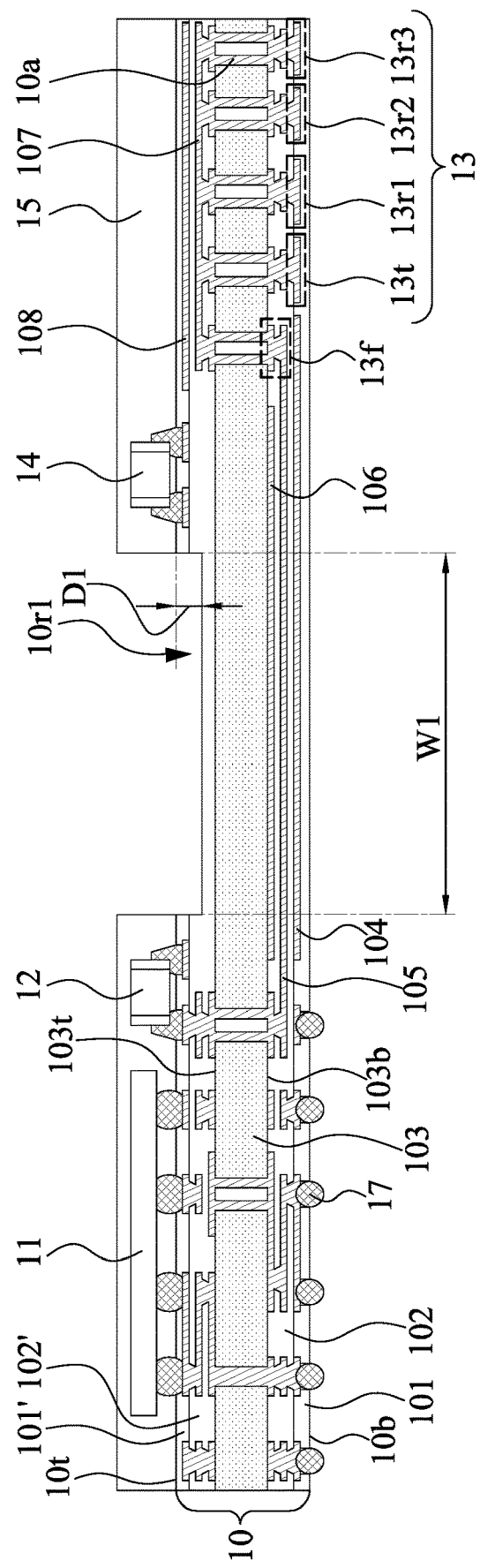
FIG. 3D illustrates a method of manufacturing a semiconductor device package according to some embodiments of the present disclosure.

Referring to FIG. 3D, a removing operation is performed. The removing operation is a saw cutting operation or a blade cutting operation. The encapsulant 15 and the dielectric layer 101' are completely removed during the saw cutting operation. A portion of the dielectric layer 102' is removed during the saw cutting operation. A recess portion 10r1 is formed during the saw cutting operation. The recess portion 10r1 has a substantially uniform width W1.

In some embodiments, the removing operation may stop at the top surface 103t of the dielectric layer 103. The saw cutting operation may be replaced with a laser cutting operation.

Figure 3E:
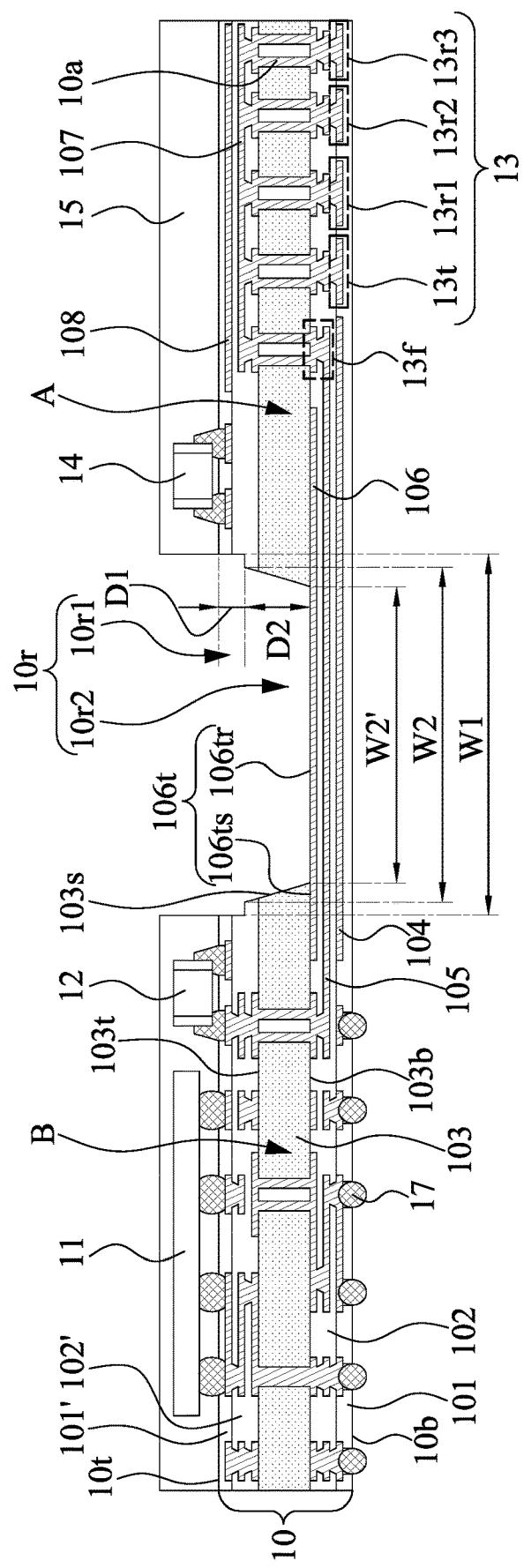
FIG. 3E illustrates a method of manufacturing a semiconductor device package according to some embodiments of the present disclosure.

Referring to FIG. 3E, another removing operation is subsequently performed. The removing operation is a laser cutting operation. The removing operation is finished when the conductive layer 106 is exposed to air. The conductive layer 106 acts as a stop element or stop layer during the laser cutting operation. The remaining portion of the dielectric layer 102' is removed during the laser cutting operation. An upper portion of the dielectric layer 102' and a lower portion of the dielectric layer 102' may define a step structure. A recess portion 10r2 is formed during the laser cutting operation. A recess 10r is formed during the laser cutting operation. The recess portion 10r2 is tapered from the dielectric layer 102' toward the dielectric layer 102. The recess portion 10r2 is discontinuous to the recess portion 10r1. A maximum width W2 of the recess portion 10r2 is less than the width W1 of the recess portion 10r1. A surface roughness Ra1 of a sidewall of the recess portion 10r1 of the recess 10r is greater than a roughness Ra2 of a sidewall of the recess portion 10r2 of the recess 10r.

The dielectric layer 103 has a rigid region A and a rigid region B after the laser cutting operation. The rigid region A and the rigid region B are separated by the bendable region of the dielectric layers 101, 102. In some embodiments, the rigid region A and the rigid region B may define an angle less than 180 degrees.

The conductive layer 106 includes a top surface having a first portion in contact with the dielectric layer 103 and a second portion exposed from the recess 10r. The second portion of the conductive layer 106 may be slightly damaged during the laser cutting operation. A surface roughness of the first portion of the top surface of the conductive layer 106 is less than a surface roughness of the second portion of the top surface of the conductive layer 106. A surface roughness of a lateral surface or a bottom surface of the conductive layer 106 is less than a surface roughness of the second portion of the top surface of the conductive layer 106.

The semiconductor package structure 1 is manufactured after the laser cutting operation.

Figure 3F:
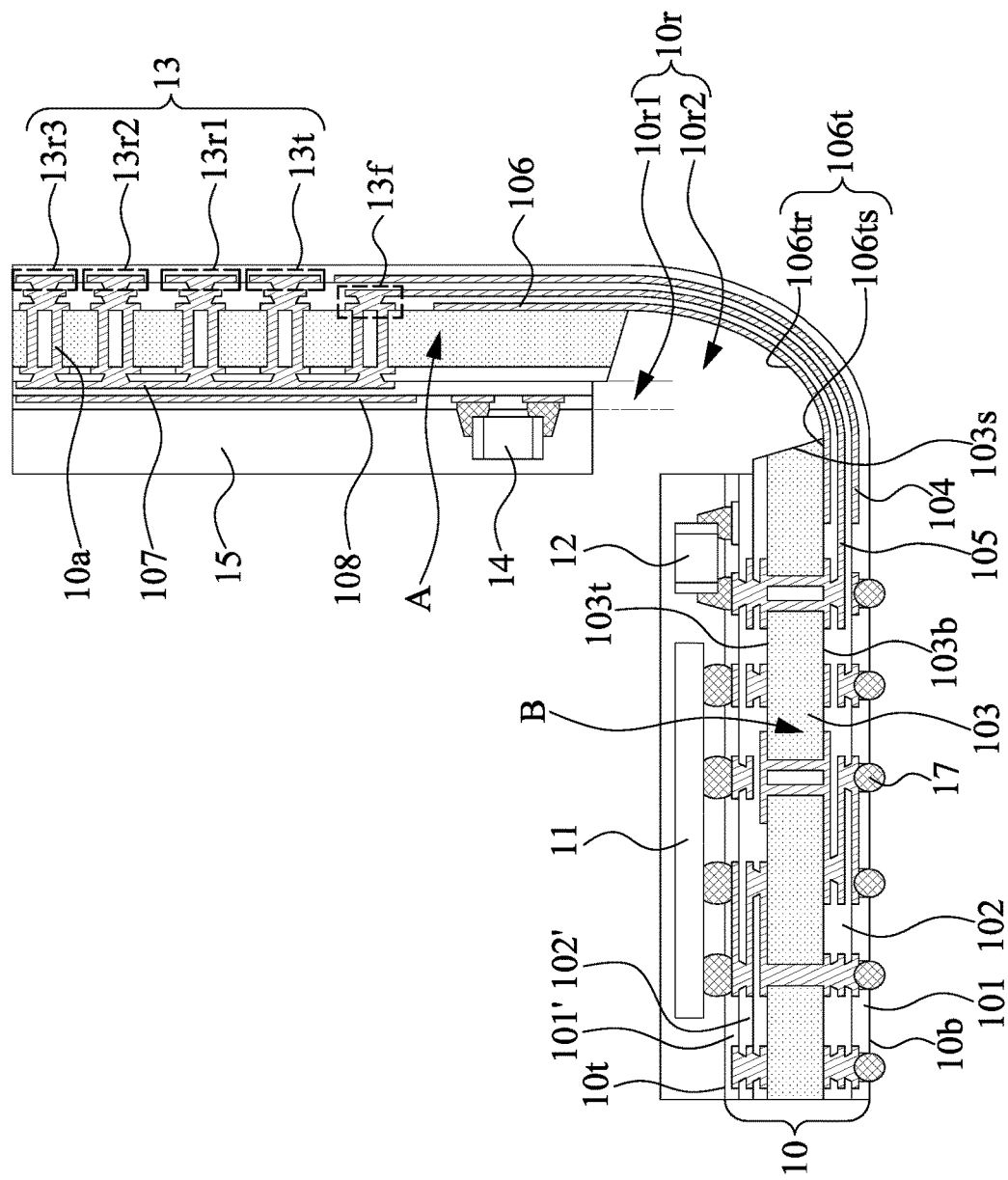
FIG. 3F illustrates a method of manufacturing a semiconductor device package according to some embodiments of the present disclosure.

Referring to FIG. 3F, the substrate 10 is configured to be bendable to adjust a respective location of the electronic component 11 and the antenna 13. The substrate 10 is bendable to change respective locations of the electronic component 11 and the antenna 13 so as to meet an optimum radiation condition for the antenna 13. In some embodiments, the rigid region A of the dielectric layer 103 of the substrate 10 may be substantially perpendicular to the rigid region B of the dielectric layer 103 of the substrate 10.

FIG. 4A through FIG. 4F illustrate some embodiments of a method of manufacturing the semiconductor device package 2 according to some embodiments of the present disclosure.

Figure 4A:
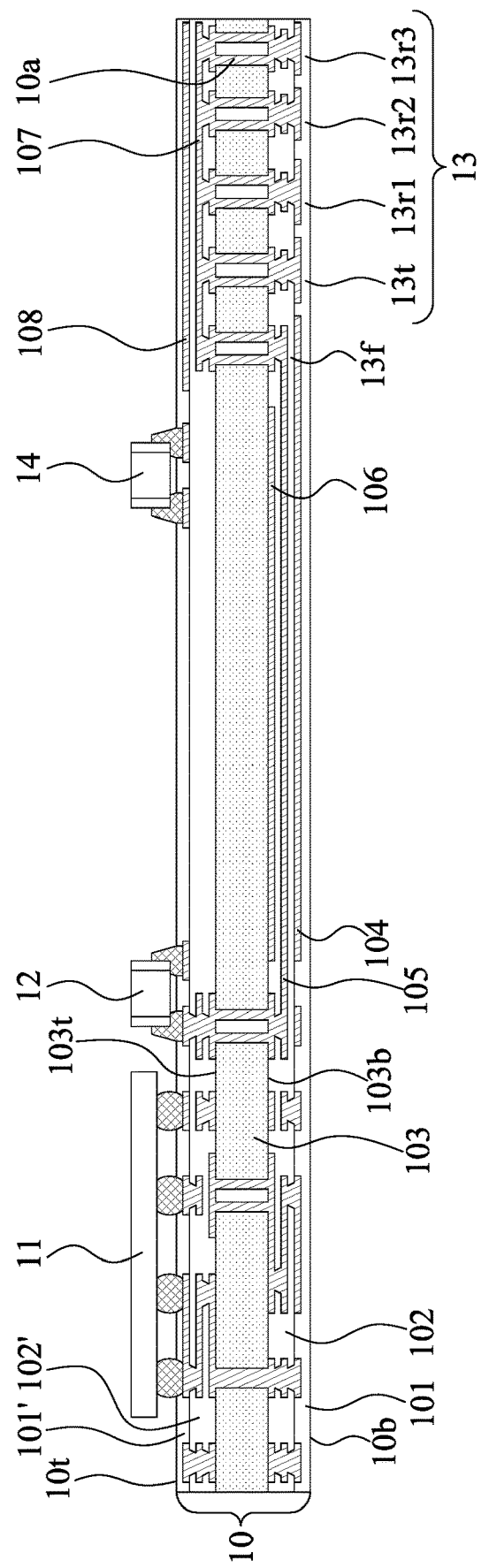
FIG. 4A illustrates a method of manufacturing a semiconductor device package according to some embodiments of the present disclosure.
Figure 4B:
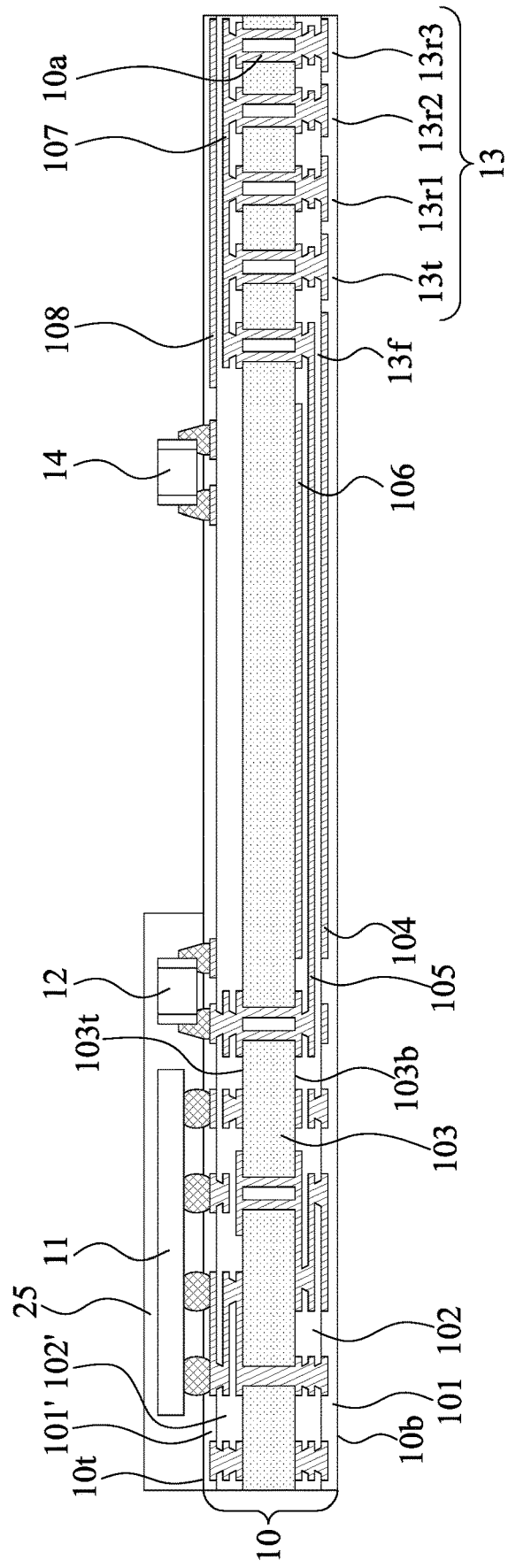
FIG. 4B illustrates a method of manufacturing a semiconductor device package according to some embodiments of the present disclosure.
Figure 4C:
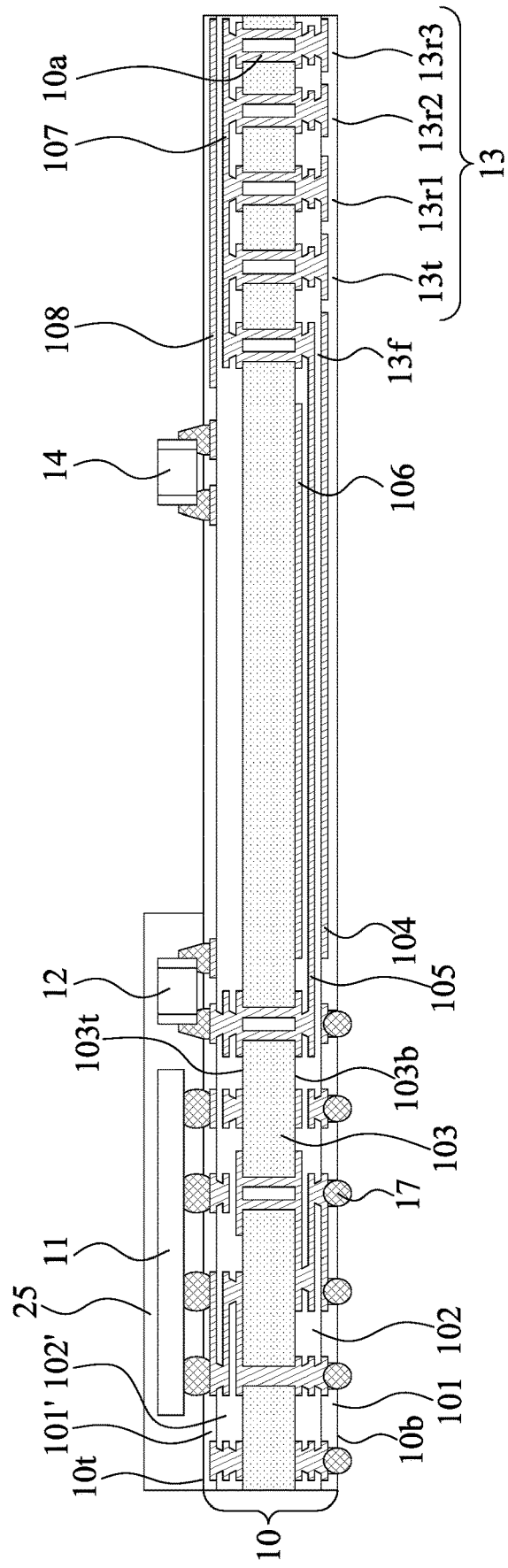
FIG. 4C illustrates a method of manufacturing a semiconductor device package according to some embodiments of the present disclosure.
Figure 4D:
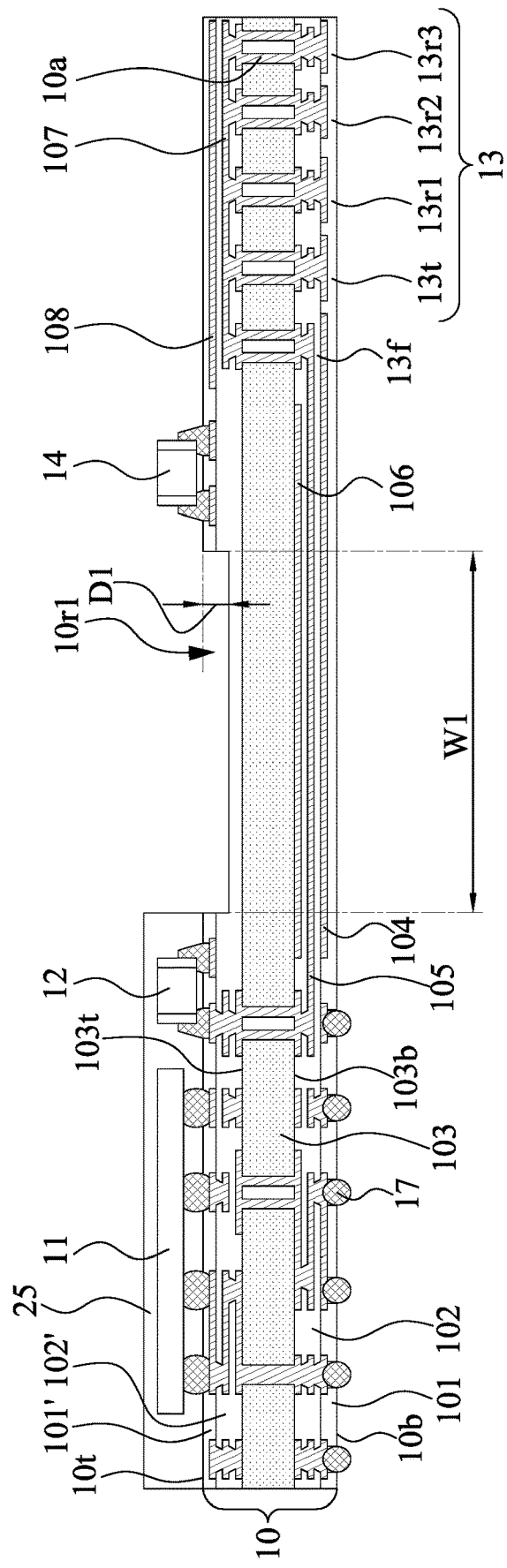
FIG. 4D illustrates a method of manufacturing a semiconductor device package according to some embodiments of the present disclosure.
Figure 4E:
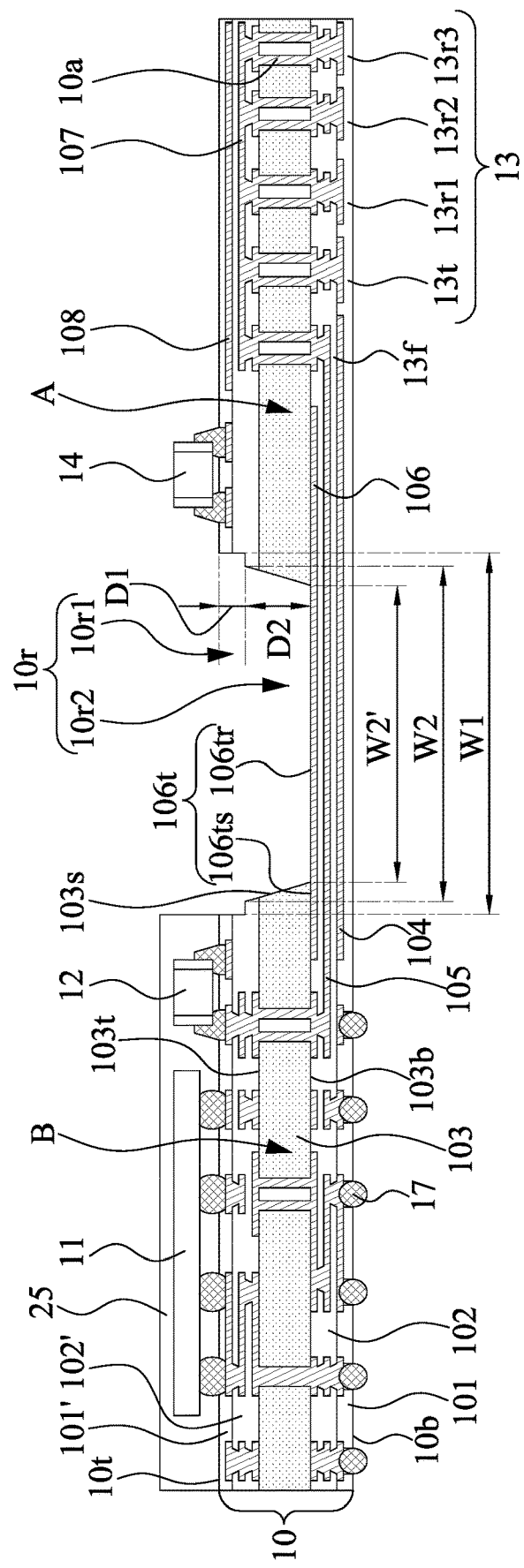
FIG. 4E illustrates a method of manufacturing a semiconductor device package according to some embodiments of the present disclosure.
Figure 4F:
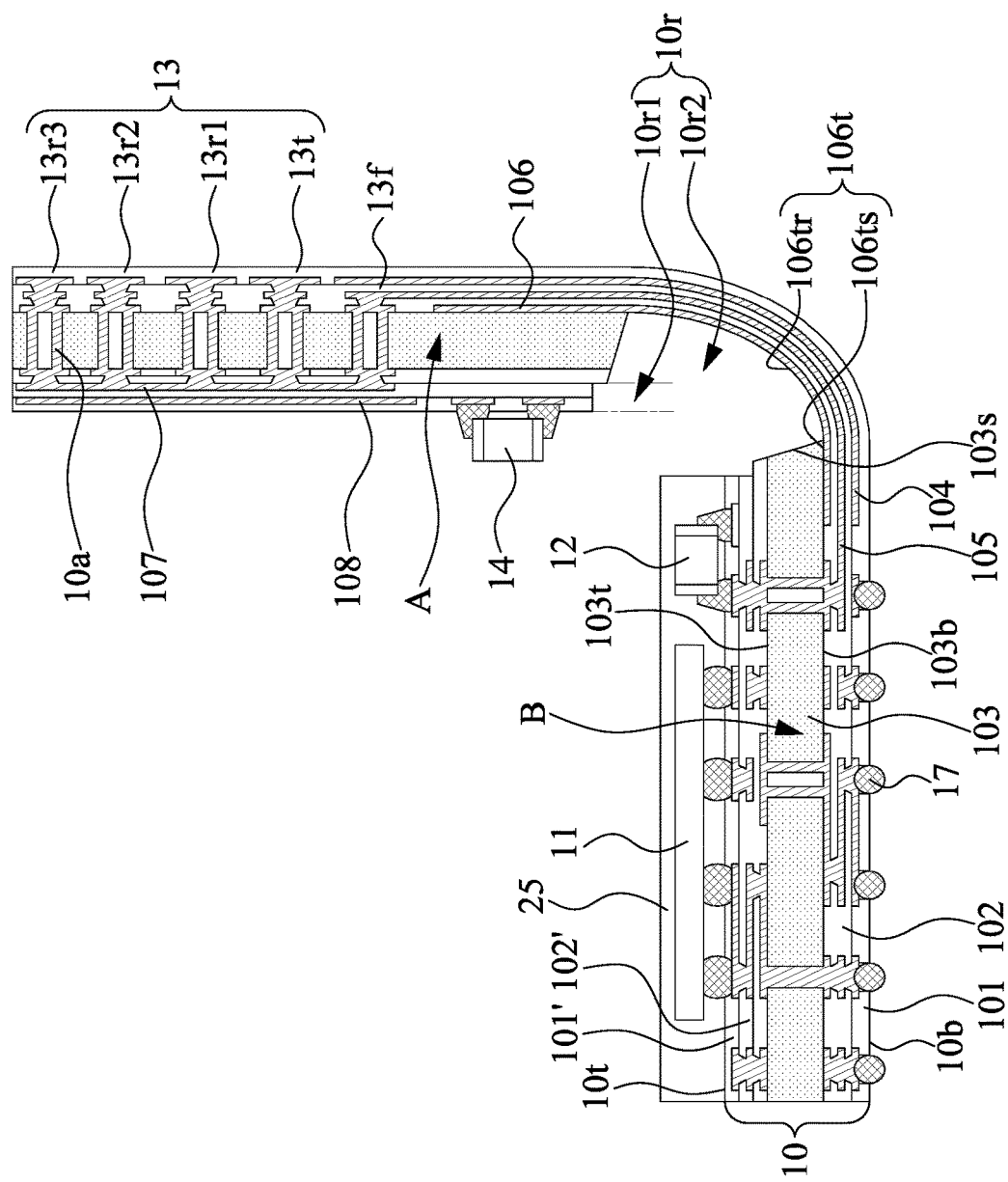
FIG. 4F illustrates a method of manufacturing a semiconductor device package according to some embodiments of the present disclosure.

The operations of the method of manufacturing the semiconductor device package 2 are similar to those of the method of manufacturing the semiconductor device package 1 in FIG. 3A through FIG. 3F except that a molding operation in FIG. 4B is a selective molding operation.

Referring to FIG. 4B, an encapsulant 25 is disposed on the rigid region B of the dielectric layer 103. The encapsulant 25 covers the electronic components 11 and 12. The electronic component 14 is exposed on the top surface 10t of the substrate 10.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An electronic apparatus, comprising:
   a substrate including a first region and a second region;
   a transmitting element disposed on the second region of the substrate and configured to radiate a first wireless signal toward an object; and
   a first receiving element disposed on the second region of the substrate and configured to receive a second wireless signal reflected from the object;
   wherein a location of the first region of the substrate is configured to be adjustable with respect to a location of the second region of the substrate,
   wherein the substrate defines a recess partially penetrating the substrate and disposed between the first region and the second region,
   wherein the substrate includes a first surface from which the recess penetrates and a second surface opposite to the first surface, and the substrate further includes a first dielectric material adjacent to the second surface of the substrate,
   wherein the substrate further includes a second dielectric material disposed on the first dielectric material, and wherein the recess fully penetrates the second dielectric material and exposes a portion of the second dielectric material, and
   wherein the second dielectric material has a first surface facing the first surface of the substrate, a second surface facing the first dielectric layer, and a lateral surface extending between the first surface of the second dielectric material and the second surface of the second dielectric material, and the lateral surface of the second dielectric material is inclined inwardly from the first surface of the second dielectric material toward the second surface of the second dielectric material.

2. The electronic apparatus of claim 1, further comprising an electronic component disposed on the first region of the substrate and electrically connected to the transmitting element and the first receiving element, wherein the electronic component is configured to generate a first signal in response to the second wireless signal, and wherein the electronic component is configured to recognize a status of the object and to adjust an operation mode of the electronic apparatus.

3. The electronic apparatus of claim 2, wherein the substrate is configured to be bendable to adjust a respective location of the transmitting element, the first receiving element, and the electronic component.

4. The electronic apparatus of claim 3, wherein the substrate includes a third region between the first region and the second region, a bendability of the third region of the substrate is higher than a bendability of the first region and the second region of the substrate.

5. The electronic apparatus of claim 4, wherein a thickness of the first region and the second region is greater than a thickness of the third region.

6. The electronic apparatus of claim 2, wherein the first signal is configured for determining an appearance of the object.

7. The electronic apparatus of claim 2, further comprising a second receiving element configured to receive a third wireless signal reflected from the object, and the electronic component is configured to generate a second signal in response to the third wireless signal and to determine a velocity of the object or a distance between the object and the second receiving element in a first dimension.

8. The electronic apparatus of claim 7, further comprising a third receiving element configured to receive a fourth wireless signal reflected from the object, and the electronic component is configured to generate a third signal in response to the fourth wireless signal and to determine a velocity of the object or a distance between the object and the third receiving element in a second dimension different from the first dimension.

9. The electronic apparatus of claim 1, wherein the transmitting element includes a first antenna unit configured to radiate a first electromagnetic wave toward the object, and the first receiving element includes a second antenna unit configured to receive a second electromagnetic wave reflected from the object.

10. The electronic apparatus of claim 1, wherein the substrate further includes a stop element disposed on the second surface of the second dielectric material, and a portion of the stop element is exposed from the recess.

11. The electronic apparatus of claim 10, wherein the stop element is configured to function as a ground.

12. The electronic apparatus of claim 10, further comprising an electronic component disposed over the first surface of the substrate; and
a conductive layer under the stop element, wherein the conductive layer electrically connects the electronic component with the transmitting element or the first receiving element.

13. An electronic apparatus, comprising:
a substrate including a first region and a second region;
a transmitting element disposed on the second region of the substrate and configured to radiate a first wireless signal toward an object; and
a first receiving element disposed on the second region of the substrate and configured to receive a second wireless signal reflected from the object;
wherein a location of the first region of the substrate is configured to be adjustable with respect to a location of the second region of the substrate, and
wherein the substrate defines a recess partially penetrating the substrate and disposed between the first region and the second region,
wherein the substrate includes a first surface from which the recess penetrates and a second surface opposite to the first surface, and the substrate further includes a first dielectric material adjacent to the second surface of the substrate,
wherein the substrate further includes a second dielectric material disposed on the first dielectric material, and wherein the recess fully penetrates the second dielectric material and exposes a portion of the second dielectric material,
wherein the substrate further includes a third dielectric material adjacent to the first surface of the substrate, and wherein the recess includes a first portion penetrating a first portion of the third dielectric material and a second portion penetrating a second portion of the third dielectric material and the second dielectric material.

14. The electronic apparatus of claim 13, wherein the second portion of the recess is tapered from the third dielectric material toward the first dielectric material.

15. The electronic apparatus of claim 13, wherein the second dielectric material is a signal resonance cavity between the antenna and a grounding layer disposed within the dielectric material.

* * * * *